(12) United States Patent
Frey et al.

(10) Patent No.: US 9,919,919 B2
(45) Date of Patent: Mar. 20, 2018

(54) LASER RESEAL INCLUDING AN ADDITIONAL LAYER AND ALLOY FORMATION

(71) Applicant: Robert Bosch GmbH, Stuttgart (DE)

(72) Inventors: Jens Frey, Filderstadt (DE); Jochen Reinmuth, Reutlingen (DE); Mawuli Ametowobla, Stuttgart (DE); Philip Kappe, Hildesheim (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 15/357,074

(22) Filed: Nov. 21, 2016

(65) Prior Publication Data

US 2017/0158496 A1    Jun. 8, 2017

(30) Foreign Application Priority Data

Dec. 8, 2015   (DE) ......................... 10 2015 224 487

(51) Int. Cl.
  *B81C 1/00* (2006.01)
  *B81B 7/00* (2006.01)
(52) U.S. Cl.
  CPC ........ *B81C 1/00293* (2013.01); *B81B 7/0077* (2013.01); *B81B 2201/0235* (2013.01); *B81B 2201/0242* (2013.01); *B81B 2203/0315* (2013.01); *B81C 2203/019* (2013.01); *B81C 2203/0136* (2013.01); *B81C 2203/0145* (2013.01)

(58) Field of Classification Search
  CPC .... B81C 2203/0145; B81C 2203/0136; B81C 2203/019; H01L 2924/0002; H01L 2924/00; H01L 23/10
  See application file for complete search history.

(56) References Cited

U.S. PATENT DOCUMENTS

| 2009/0174148 A1* | 7/2009 | Bischof ............... B81C 1/00293 277/316 |
| 2010/0190301 A1* | 7/2010 | Delapierre .......... B81C 1/00293 438/124 |

FOREIGN PATENT DOCUMENTS

WO         2015120939 A1    8/2015

\* cited by examiner

*Primary Examiner* — Jaehwan Oh
(74) *Attorney, Agent, or Firm* — Norton Rose Fulbright US LLP; Gerard Messina

(57) ABSTRACT

A method for manufacturing a micromechanical component including a substrate and a cap, which is connected to the substrate and, together with the substrate, encloses a cavity, a pressure prevailing and gas mixture having a chemical composition being enclosed in the cavity. An access opening connecting the to surroundings of the micromechanical component is formed in the substrate or in the cap. The pressure and/or chemical composition are/is adjusted in the cavity. The access opening is sealed by introducing energy or heat into an absorbing part of the substrate or of the cap with the aid of a laser. A layer is deposited on or grown on a surface of the substrate or of the cap in the area of the access opening for mixing with a material area of the substrate or of the cap, which is converted into a liquid aggregate state.

7 Claims, 2 Drawing Sheets

LASER RESEAL INCLUDING AN ADDITIONAL LAYER AND ALLOY FORMATION

CROSS REFERENCE

The present application claims the benefit under 35 U.S.C. § 119 of German Patent Application No. DE 102015224487.3 filed on Dec. 8, 2015, which is expressly incorporated herein by reference in its entirety.

BACKGROUND INFORMATION

A method is described in PCT Application No. WO 2015/120939 A1. In this method, when a certain internal pressure is desired in a cavity of a micromechanical component or a gas mixture having a certain chemical composition is to be enclosed in the cavity, the internal pressure or the chemical composition is frequently adjusted during capping of the micromechanical component or during the bonding process between a substrate wafer and a cap wafer. During capping, for example, a cap is connected to a substrate, whereby the cap and the substrate together enclose the cavity. By adjusting the atmosphere or the pressure and/or the chemical composition of the gas mixture present in the surroundings during capping, it is thus possible to adjust the particular internal pressure and/or the particular chemical composition in the cavity.

With the aid of the method described in PCT Application No. WO 2015/120939 A1, an internal pressure may be adjusted in a targeted way in a cavity of a micromechanical component. It is in particular possible with the aid of this method to manufacture a micromechanical component including a first cavity, a first pressure and a first chemical composition being 27697758.1 adjustable in the first cavity, which differ from a second pressure and a second chemical composition at the time of capping.

In the method for targeted adjusting of an internal pressure in a cavity of a micromechanical component according to PCT Application No. WO 2015/120939 A1, a narrow access channel to the cavity is created in the cap or in the cap wafer, or in the substrate or in the sensor wafer. Subsequently, the cavity is flooded with the desired gas and the desired internal pressure via the access channel. Finally, the area around the access channel is locally heated with the aid of a laser, the substrate material liquefies locally and hermetically seals the access channel during solidification.

SUMMARY

It is an object of the present invention to provide a method for manufacturing a micromechanical component which is mechanically robust and has a long service life compared to the related art, in a simple and cost-effective manner compared to the related art. It is a further object of the present invention to provide a micromechanical component which is compact, mechanically robust and has a long service life compared to the related art. According to the present invention, this applies, in particular, to a micromechanical component that includes one (first) cavity. With the aid of the method according to the present invention and the micromechanical component according to the present invention, it is furthermore also possible to implement a micromechanical component in which a first pressure and a first chemical composition may be adjusted in the first cavity, and a second pressure and a second chemical composition may be adjusted in a second cavity. For example, such a method for manufacturing micromechanical components is provided, for which it is advantageous if a first pressure is enclosed in a first cavity and a second pressure is enclosed in a second cavity, the first pressure being different from the second pressure. This is the case, for example, when a first sensor unit for rotation rate measurement and a second sensor unit for acceleration measurement are to be integrated into a micromechanical component.

The object is achieved in that
in a fourth method step, a layer is deposited on or grown on a surface of the substrate or of the cap in the area of the access opening for mixing with a material area of the substrate or of the cap, which is converted into a liquid aggregate state in the third method step.

In this way, a method for manufacturing a micromechanical component is provided in a simple and cost-effective manner, with which the layer, together with the material area of the substrate or of the cap, may be converted into a liquid aggregate state. Thus, it is possible, by mixing the layer with the material area, to adjust the properties of a mixed material, which includes at least partly the layer and at least partly the material area, in a targeted manner. Thus, it is, in particular, possible for example, to seal the access opening with the aid of the mixed material. The likelihood of a crack formation in the area of the access opening, for example, may be reduced, or the resistance to crack formation in the area of the access opening may be increased. In addition, the mechanical robustness of the area of the access opening may be increased, for example.

In addition, it is less problematic with the method according to the present invention if the substrate material is only heated locally, and the heated material contracts relative to its surroundings, both during solidification and during cooling, since, for example, a contraction during solidification and during cooling may be reduced in a targeted manner by skillful selection of the material of the layer. It is also less problematic that tensile stresses may develop in the sealing area, since these tensile stresses may be reduced in a targeted manner by skillful selection of the material of the layer. Thus, a spontaneously occurring crack formation depending on the stress and material and a crack formation during thermal or mechanical loading of the micromechanical component is also less likely during the further processing or in the field.

According to the present invention, the area of the access opening means, in particular, the solidified mixed material and/or the interfaces between the solidified mixed material and the remaining substrate or the remaining cap and/or the area all around the interfaces.

In addition, the absorbing part of the substrate or of the cap includes, for example, at least partially the layer and at least partially the material area of the substrate or of the cap.

In connection with the present invention, the term "micromechanical component" is to be understood in that the term encompasses both micromechanical components and microelectromechanical components.

The present invention is preferably provided for a micromechanical component including a cavity or its manufacture. However, the present invention is also provided, for example, for a micromechanical component having two cavities, or having more than two, i.e., three, four, five, six or more than six, cavities.

The access opening is preferably sealed by introducing energy or heat with the aid of a laser into a part of the substrate or of the cap which absorbs this energy or this heat. Energy or heat is preferably introduced chronologically in succession into the respective absorbing part of the substrate or of the cap of multiple micromechanical components, which are manufactured together on a wafer, for example. However, alternatively, it is also possible to introduce the energy or heat simultaneously into the respective absorbing part of the substrate or of the cap of multiple micromechanical components, for example using multiple laser beams or laser devices.

Advantageous embodiments and refinements of the present invention may be derived from the description herein with reference to the figures.

According to one preferred refinement, it is provided that the cap, together with the substrate, encloses a second cavity, a second pressure prevailing and a second gas mixture having a second chemical composition being enclosed in the second cavity.

According to one preferred refinement, it is provided that the layer is deposited on or grown on a surface of the substrate or of the cap, which faces away from the first cavity. In this way, it is advantageously possible for the layer, together with the material area on the surface of the substrate or of the cap facing away from the first cavity, to be transformed into a liquid aggregate state.

According to one preferred refinement, it is provided that the fourth method step is carried out chronologically before the first method step. This advantageously makes it possible to deposit or grow the layer on the surface chronologically before the formation of the access opening.

The present invention also includes a micromechanical component including a substrate and a cap which is connected to the substrate and, together with the substrate, encloses a first cavity, a first pressure prevailing and a first gas mixture having a first chemical composition being enclosed in the first cavity, the substrate or the cap including a sealed access opening, the micromechanical component including a layer deposited or grown on a surface of the substrate or of the cap in the area of the access opening and mixed at least partially with a material area of the substrate or of the cap, which is converted during the sealing of the access opening into a liquid aggregate state. In this way, a compact, mechanically robust and cost-effective micromechanical component having an adjusted first pressure is advantageously provided. The above-mentioned advantages of the method according to the present invention apply correspondingly also to the micromechanical component according to the present invention.

According to one preferred refinement, it is provided that the layer is situated on a surface of the substrate or of the cap, which faces away from the first cavity. In this way, it is advantageously possible for the layer, together with at least parts of the material area, to be at least partially transformable into a liquid aggregate state on the surface of the substrate or of the cap, which faces away from the first cavity, and thus the access opening is sealable with a mixed material, which includes at least partially the layer and at least partially the material area.

According to one preferred refinement, it is provided that the melting temperature of the layer is lower than the melting temperature of the material area and/or lower than the melting temperature of the substrate and/or lower than the melting temperature of the cap. This enables the melting temperature of the mixed material, which includes at least partially the layer and at least partially the material area, to be adjusted in a targeted manner, or to be adjusted lower than the melting temperature of the material area and/or lower than the melting temperature of the substrate and/or lower than the melting temperature of the cap.

According to one preferred refinement, it is provided that the melting temperature of a mixed material, which includes at least partially the layer and at least partially the material area, is lower than the melting temperature of the layer and/or lower than the melting temperature of the material area and/or lower than the melting temperature of the substrate and/or lower than the melting temperature of the cap. This advantageously allows for the relatively low adjustability of the melting temperature of the mixed material, so that the mixed material solidifies at a relatively low temperature.

According to one preferred refinement, it is provided that the expansion coefficient of the layer is lower than the expansion coefficient of the material area and/or lower than the expansion coefficient of the substrate and/or lower than the expansion coefficient of the cap. This advantageously makes it possible for the layer or the mixed material to contract to a lesser extent than the material area or the substrate or the cap during cooling.

According to one preferred refinement, it is provided that the cap, together with the substrate, encloses a second cavity, a second pressure prevailing and a second gas mixture having a second chemical composition being enclosed in the second cavity. In this way, a compact, mechanically robust and cost-effective micromechanical component having an adjusted first pressure and second pressure is advantageously provided.

According to one preferred refinement, it is provided that the first pressure is lower than the second pressure, a first sensor unit for rotation rate measurement being situated in the first cavity, and a second sensor unit for acceleration measurement being situated in the second cavity. In this way, a mechanically robust micromechanical component for rotation rate measurement and acceleration measurement, having optimal operating conditions for both the first sensor unit and the second sensor unit, is advantageously provided.

DETAILED DESCRIPTION OF EXAMPLE EMBODIMENTS

Figure 1:
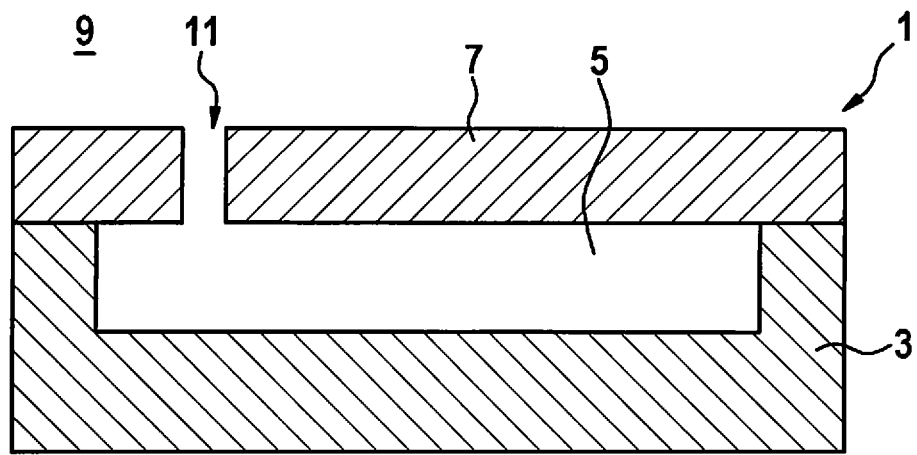
FIG. 1 shows a micromechanical component having an open access opening according to one exemplary specific embodiment of the present invention in a schematic representation.

Identical parts are denoted by the same reference numerals in the various figures and are therefore generally also cited or mentioned only once.

Figure 2:
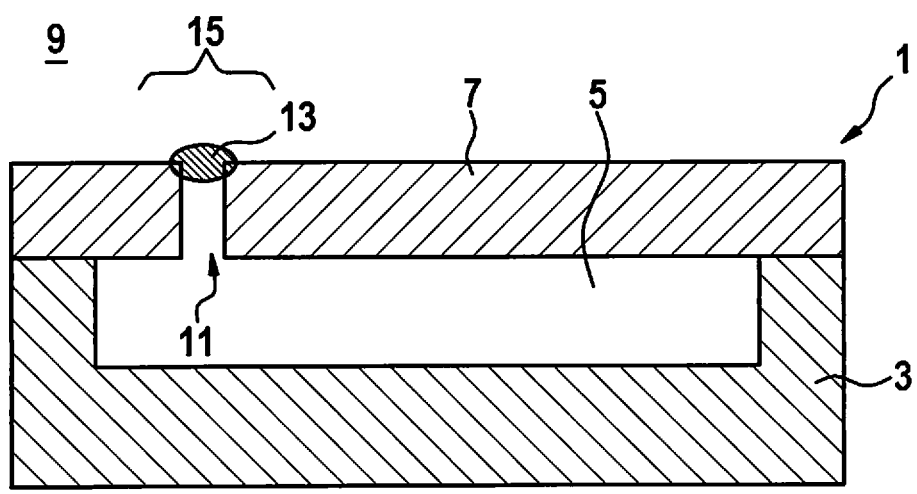
FIG. 2 shows the micromechanical component according to FIG. 1 having a sealed access opening in a schematic representation.

FIG. 1 and FIG. 2 show a schematic representation of a micromechanical component 1 having an open access opening 11 in FIG. 1, and having a sealed access opening 11 in FIG. 2, according to one exemplary specific embodiment of the present invention. Micromechanical component 1 includes a substrate 3 and a cap 7. Substrate 3 and cap 7 are, preferably hermetically, connected to one another and together enclose a first cavity 5. For example, micromechanical component 1 is designed in such a way that substrate 3 and cap 7 additionally together enclose a second cavity. The second cavity, however, is not shown in FIG. 1 and in FIG. 2.

For example, a first pressure prevails in first cavity 5, in particular when access opening 11 is sealed, as shown in FIG. 2. Moreover, a first gas mixture having a first chemical composition is enclosed in first cavity 5. In addition, for example, a second pressure prevails in the second cavity, and a second gas mixture having a second chemical composition is enclosed in the second cavity. Access opening 11 is preferably situated in substrate 3 or in cap 7. In the present exemplary embodiment, access opening 11 is situated in cap 7 by way of example. According to the present invention, however, it may also be alternatively provided that access opening 11 is situated in substrate 3.

It is provided, for example, that the first pressure in first cavity 5 is lower than the second pressure in the second cavity.

It is also provided, for example, that a first micromechanical sensor unit for rotation rate measurement, which is not shown in FIG. 1 and FIG. 2, is situated in first cavity 5, and a second micromechanical sensor unit for acceleration measurement, which is not shown in FIG. 1 and FIG. 2, is situated in the second cavity.

Figure 3:
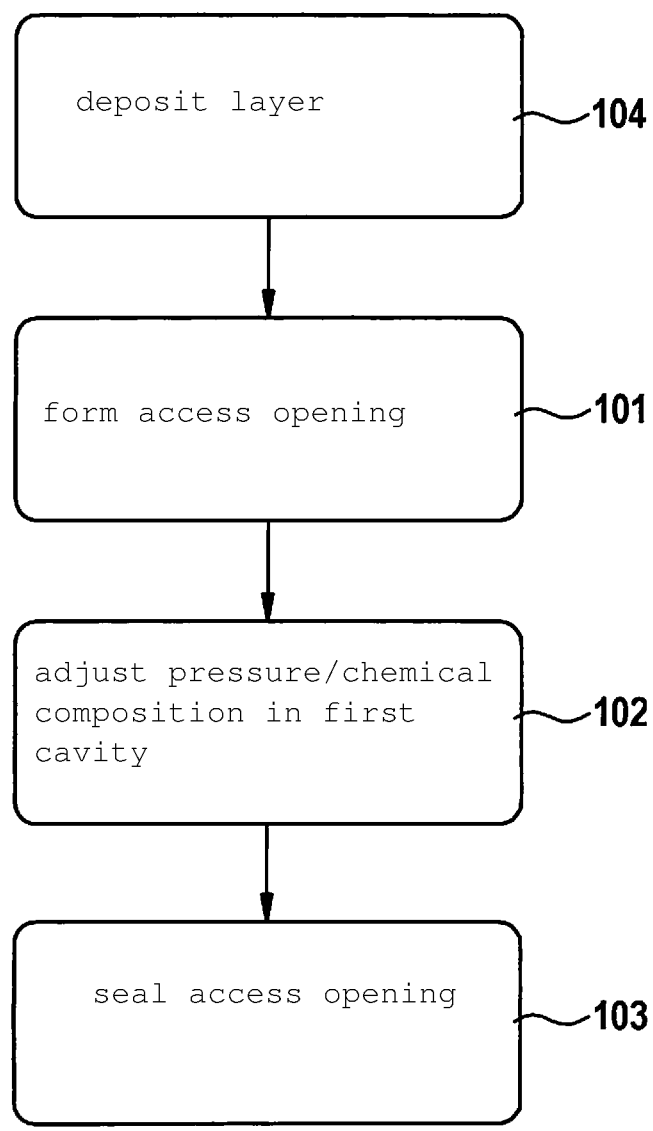
FIG. 3 shows a method for manufacturing a micromechanical component according to one exemplary specific embodiment of the present invention in a schematic representation.

FIG. 3 shows a method for manufacturing micromechanical component 1 according to one exemplary specific embodiment of the present invention in a schematic representation. In this method, in a first method step 101, in particular narrow access opening 11 connecting first cavity 5 to surroundings 9 of micromechanical component 1 is formed in substrate 3 or in cap 7. FIG. 1 shows micromechanical component 1 after first method step 101 by way of example. Moreover, in a second method step 102, the first pressure and/or the first chemical composition in first cavity 5 is adjusted, or first cavity 5 is flooded with the desired gas and the desired internal pressure via the access channel. Furthermore, for example, in a third method step 103, access opening 11 is sealed by introducing energy or heat with the aid of a laser into an absorbing part 21 of substrate 3 or cap 7. Alternatively, for example, it is also provided that in the third method step 103, the area around the access channel is preferably heated only locally by a laser, and the access channel is hermetically sealed. Thus, it is advantageously possible to also provide the method according to the present invention with energy sources other than with a laser for sealing access opening 11. FIG. 2 shows micromechanical component 1 after third method step 103 by way of example.

Chronologically after third method step 103, it is possible for mechanical stresses to occur in a lateral area 15, shown by way of example in FIG. 2, on a surface facing away from cavity 5 of cap 7 and in the depth perpendicularly to a projection of lateral area 15 onto the surface, i.e., along access opening 11 and in the direction of first cavity 5 of micromechanical component 1. These mechanical stresses, in particular local mechanical stresses, prevail in particular on and in the vicinity of an interface between a material area 13 of cap 7, which in third method step 103 transitions into a liquid aggregate state and after third method step 103 transitions into a solid aggregate state and seals access opening 11, and a remaining area of cap 7, which remains in a solid aggregate state during third method step 103. In FIG. 2, material area 13 of cap 7 sealing access opening 11 is to be regarded only schematically or is shown only schematically, in particular with respect to its lateral extension or form, extending in particular in parallel to the surface, and in particular with respect to its expansion or configuration perpendicularly to the lateral extension, running in particular perpendicularly to the surface.

As shown in FIG. 3 by way of example, in addition, in a fourth method step 104, a layer is deposited on or grown on a surface of substrate 3 or of cap 7 or of a MEMS substrate (or of another type of encapsulation layer of a MEMS structure) in the area of access opening 11 for mixing with a material area 13 of substrate 3 or of cap 7, which is converted into a liquid aggregate state in third method step 103. In other words, a layer of a second material is applied to substrate 3 or to cap 7 or to the substrate material, the substrate material and the second material both being melted and mixed during the local heating process. The layer or the additional layer in this case includes, for example, a material, which differs from the substrate material or from the cap material. In addition, it is also provided, for example, that the layer includes at least one crystalline structure and/or doping, which deviates from the substrate or from the cap.

It is also provided, for example, that in addition, in fourth method step 104, an additional layer or a plurality of additional layers is deposited on or grown on the surface of substrate 3 or of cap 7 or of the MEMS substrate (or of another type of encapsulation layer of a MEMS structure) in the area of access opening 11 for mixing together with a material area 13 of substrate 3 or of cap 7, which is converted into a liquid aggregate state in third method step 103.

Furthermore, it is provided, for example, that in first method step 101, the access opening or the narrow access channel to the MEMS cavity is created or formed in substrate 3 or in cap 7 or in the cap wafer or in the sensor wafer as well as in the layer or through the layer. Moreover, it is provided, for example that the area around the access channel is preferably locally heated by a laser and the access channel is hermetically sealed.

By selecting the material of the layer or of the additional layer or of the plurality of additional layers and subsequently mixing the layer or the additional layer or the plurality of additional layers with material area 13, it is thus possible to influence the properties of the mixed material in a targeted manner. A reduction of the crack formation by one or multiple of the following effects, as well as additional effects not listed, may be achieved in a fourth method step 104, for example.

Effects, which reduce, for example, the tensile stress in the system:
The solidification temperature in many mixed systems is often lower than in pure systems. The mixture of substrate material with a second material may therefore reduce the solidification temperature. In such systems, in which the temperature expansion coefficient is virtually identical, less stress accumulates as a result of the lower temperature difference between the melted area and the surroundings.
A mixed system may be used, which has an anomaly during solidification. That is, the material expands during solidification, as happens, for example, when water freezes.
A second material may be used or another mixed material, which has a lower thermal expansion coefficient than the substrate material.

A second material may be used, which crystallizes in the mixture with the substrate material during solidification in a crystalline structure, which reacts to the crystalline orientation of the substrate material and preferably crystallizes with compression stress.

The mixed material including at least partially material area 13 and at least partially the layer or the new mixed material is more easily deformable and, with an inelastic deformation, may react better than the substrate material to the stress, which is induced by the solidification process and the local cooling.

The mixed material or the new sealing material (mixture of the two materials) has a higher mechanical robustness.

The fracture resistance of the mixed material is higher than the fracture resistance of the substrate material due to an elastic modulus of the mixed materials, which differs from the elastic modulus of the substrate material.

The new mixed material is more easily plastically deformable and thus may react with a deformation to a stress applied from outside or to a tension applied from the outside.

The material or the mixed material is less sensitive to crack formation due to its altered crystalline structure, in particular, micro-cracks are unable to propagate and result in a rupturing of the entire sealing area.

Furthermore, it is provided according to the present invention that the micromechanical component includes the mixed material, which includes at least partially the layer and at least partially the material area in the sealing area or in the area of sealed access opening 11. In other words, it is provided, for example, that the substrate material or the cap material and the additional material or the layer material (or the material of the layer) are at least partially mixed in the sealing area or in the area of sealed access opening 11.

In such case, it is provided, for example, that the layer material or the material of the additional layer includes a lower melting point than the substrate material or the cap material. The melting point of pure germanium (Ge), for example, is 937° C. and the melting point of silicon (Si) is 1410° C. The melting point of the SiGe mixed crystal lies between the melting points of germanium and silicon and may be adjusted via the Si ratio and Ge ratio.

Moreover, it is provided, for example, that the mixed material has a lower melting point than the two materials individually or than the layer material, and lower than the substrate material or the cap material. It is provided, in particular, that the melting temperature of the mixed material is adjusted with the aid of a combination of Si and aluminum or Al or Si and gold or Au.

In addition, it is provided according to the present invention that the mixed material or the mixed system and/or the layer material and/or the substrate material or the cap material exhibits an anomaly during solidification. It is provided, in particular, that the substrate and/or the cap includes silicon.

Furthermore, it is provided that the layer material or the mixed material has a lower thermal expansion coefficient than the substrate material or the cap material.

Moreover, it is provided, for example, that the mixed material or a second material, which crystallizes in mixture with the substrate material or with the cap material during solidification in a crystalline structure, which reacts to the crystalline orientation of the substrate material or of the cap material in such a way that the mixed material or the second material in mixture with the substrate material or in mixture with the cap material crystallizes preferably with compression stress, for example, if a coherent lattice distortion exists. It is provided, for example, that the layer includes a Ge layer or a SiGe layer or another layer, which contains Ge. The lattice constant of Ge in such a case is 5.646 Å as compared to Si with 5.431 Å. A lattice distortion or a lattice constant of a mixed crystal results, for example, from the mixture ratio via Vegard's Law in a $(Si_{1-x}Ge_x)=a_{si}+x(a_{Ge}-a_{si})$, a $(Si_{1-x}Ge_x)$ being the lattice constant of the resulting $Si_{1-x}Ge_x$ mixed crystal, $a_{si}$ and $a_{Ge}$ being the lattice constants of Si and Ge and x being the percentage of the component Ge. It is also provided, for example, that the layer includes one element or multiple elements, which assume intermediate lattice positions in the mixed material or gaps in the crystal lattice of the mixed material for producing lattice distortions in the mixed material.

It is further provided, for example, that a layer material is used, which is more easily deformable. It is provided, for example, that the layer material or the mixed material exhibits a more inelastic deformation behavior than the substrate material or than the cap material. In other words, the layer material or the mixed material may react more inelastically than the substrate material or the cap material, for example, to tensions present or to active forces or to forces acting on micromechanical component 1. It is provided in particular in such case, for example, that the mixed material or the mixture of layer material and substrate material or the mixture of layer material and cap material exhibits a more inelastic deformation behavior than the substrate material or than the cap material. The layer material includes, for example, aluminum or Al and/or gold or Au.

In addition, it is provided, for example, that the elastic modulus of the layer or of the mixed material differs essentially by more than 15% from the elastic modulus of the substrate material or of the cap material. In addition, it is alternatively provided, for example, that the elastic modulus of the layer or of the mixed material is 1.15 times, in particular, more than 1.15 times, or 0.85 times, in particular, less than 0.85 times, the elastic modulus of the substrate material or of the cap material.

Furthermore, it is provided, for example, that the layer or the mixed material is inelastically, in particular, plastically or at least partially plastically and/or elastoplastically and/or plastoelastically deformable or may react inelastically during the solidification process or cooling process.

Moreover, it is provided that the mixed material includes a homogenous phase, in particular, in the liquid aggregate state. In addition, it is provided, for example, that the mixed material includes at least two, in particular, three, four, five, six, seven, eight or more than eight phases, in particular, in the solid aggregate state. In other words, it is provided, for example, to use a mixed system of layer material or additional layer and substrate material or cap material, which is homogenously mixed in the melted state and which becomes partially separated again or is split into multiple phases before, during or after solidification or partial solidification and cooling. It is provided in such case, for example, that at least one phase of the phases in the solid aggregate state of the mixed material or one of the two materials or interfaces between two phases of the phases or the interface of the materials inhibits the propagation of, for example, micro-cracks or exhibits increased resistance to crack formation compared to the related art.

Finally, it is provided that the layer material or the second material includes a material which, in particular, in the liquid aggregate state, is completely mixable with silicon, in particular, in the liquid aggregate state and solidifies as a mixed crystal. It is also provided, for example, that a liquid phase of a layer material or of a second material and silicon solidifies as a mixed crystal. The layer material or the mixed material includes, for example, in particular, in the solid aggregate phase, a $Si_xGe_{1-x}$ mixed crystal. This is advantageous, in particular, if the mixed material or the mixed system solidifies with a lower tensile stress than the pure material or the layer material or the substrate material or the cap material.

What is claimed is:

1. A micromechanical component, comprising:
   a substrate;
   a cap connected to the substrate, the cap, together with the substrate, enclosing a first cavity, a first pressure prevailing and a first gas mixture having a first chemical composition being enclosed in the first cavity, the substrate or the cap including a sealed access opening; and
   a layer deposited on or grown on a surface of the substrate or of the cap in the area of the access opening, which is at least partially mixed with a material area of the substrate or of the cap, which is converted into a liquid aggregate state during the sealing of the access opening.

2. The micromechanical component as recited in claim 1, wherein the layer is situated on a surface of the substrate or of the cap, which faces away from the first cavity.

3. The micromechanical component as recited in claim 1, wherein a melting temperature of the layer is lower than at least one of:
   a melting temperature of the material area, a melting temperature of the substrate, and a melting temperature of the cap.

4. The micromechanical component as recited in claim 3, wherein a melting temperature of a mixed material including at least partially the layer and at least partially the material area is lower than at least one of:
   the melting temperature of the layer, the melting temperature of the material area, the melting temperature of the substrate, and the melting temperature of the cap.

5. The micromechanical component as recited in claim 1, wherein an expansion coefficient of the layer is lower than at least one of: an expansion coefficient of the material area, an expansion coefficient of the substrate, and an expansion coefficient of the cap.

6. The micromechanical component as recited in claim 5, wherein the cap, together with the substrate, enclose a second cavity, a second pressure prevailing and a second gas mixture having a second chemical composition being enclosed in the second cavity.

7. The micromechanical component claim 6, wherein the first pressure is lower than the second pressure, a first sensor unit for rotation rate measurement being situated in the first cavity and a second sensor unit for acceleration measurement being situated in the second cavity.

* * * * *